US009653514B2

(12) United States Patent
Tachino et al.

(10) Patent No.: US 9,653,514 B2
(45) Date of Patent: May 16, 2017

(54) SOLID-STATE IMAGING DEVICE AND METHOD FOR DRIVING THE SAME

(71) Applicant: DENSO CORPORATION, Kariya, Aichi-pref. (JP)

(72) Inventors: Yoshihide Tachino, Kariya (JP); Takahisa Yamashiro, Chiryu (JP); Yukiaki Yogo, Okazaki (JP)

(73) Assignee: DENSO CORPORATION, Kariya (JP)

( * ) Notice: Subject to any disclaimer, the term of this patent is extended or adjusted under 35 U.S.C. 154(b) by 424 days.

(21) Appl. No.: 14/363,965

(22) PCT Filed: Feb. 6, 2013

(86) PCT No.: PCT/JP2013/000625
§ 371 (c)(1),
(2) Date: Jun. 9, 2014

(87) PCT Pub. No.: WO2013/118492
PCT Pub. Date: Aug. 15, 2013

(65) Prior Publication Data
US 2014/0299747 A1 Oct. 9, 2014

(30) Foreign Application Priority Data

Feb. 9, 2012 (JP) .................................. 2012-26446
Jan. 23, 2013 (JP) ................................. 2013-010518

(51) Int. Cl.
*H01L 27/146* (2006.01)
*H01L 27/148* (2006.01)
*H04N 5/372* (2011.01)

(52) U.S. Cl.
CPC .. *H01L 27/14806* (2013.01); *H01L 27/14614* (2013.01); *H01L 27/14623* (2013.01); *H01L 27/14689* (2013.01); *H04N 5/37213* (2013.01)

(58) Field of Classification Search
CPC ......... H01L 27/14614; H01L 27/14623; H01L 27/14689; H01L 27/146; H01L 27/14806;
(Continued)

(56) References Cited

U.S. PATENT DOCUMENTS 6,278,142 B1    8/2001  Hynecek
7,522,205 B2 *  4/2009  Parks ................... H04N 3/1575
                                                         348/283

(Continued)

FOREIGN PATENT DOCUMENTS

JP    5-335449 A    12/1993
JP    7-176721 A     7/1995
(Continued)

OTHER PUBLICATIONS

International Search Report mailed Apr. 2, 2013 in a corresponding PCT application No. PCT/JP2013/000625 (and English translation).

(Continued)

*Primary Examiner* — John Lee
(74) *Attorney, Agent, or Firm* — Posz Law Group, PLC

(57) ABSTRACT

A solid-state imaging device includes: multiple pixels. Each pixel is arranged at a surface layer portion of a semiconductor substrate, and includes: a photoelectric conversion portion that converts light incident into an electric charge; a charge holding portion that stores the electric charge, and is arranged in the semiconductor substrate; a multiplication gate electrode that is capacitively coupled with the charge holding portion, and is arranged on the semiconductor substrate via an insulation film; and a charge barrier portion that is arranged between the charge holding portion and the insulation film, and has a higher impurity concentration than the semiconductor substrate.

19 Claims, 15 Drawing Sheets

(58) Field of Classification Search
CPC ... H01L 27/148; H04N 5/37213; H04N 5/372
See application file for complete search history.

(56) References Cited

U.S. PATENT DOCUMENTS

| | | | | |
|---|---|---|---|---|
| 7,619,196 | B2* | 11/2009 | Oda | H01L 27/14603 250/208.1 |
| 7,642,499 | B2* | 1/2010 | Shimizu | H01L 27/14603 250/208.1 |
| 7,821,042 | B2* | 10/2010 | Nakashima | H01L 27/14831 257/217 |
| 7,847,845 | B2* | 12/2010 | Parks | H04N 3/1575 348/294 |
| 8,154,060 | B2* | 4/2012 | Nakashima | H01L 27/14603 257/291 |
| 8,592,740 | B2* | 11/2013 | Mayer | H01L 27/14603 250/208.1 |
| 8,692,175 | B2* | 4/2014 | Fereyre | H04N 5/35572 250/207 |
| 9,040,890 | B2* | 5/2015 | Fereyre | H04N 5/3745 250/208.1 |
| 2003/0223531 | A1 | 12/2003 | Kashima et al. | |
| 2006/0055802 | A1* | 3/2006 | Parks | H04N 3/1575 348/311 |
| 2007/0176213 | A1 | 8/2007 | Oda | |
| 2008/0048212 | A1* | 2/2008 | Nakashima | H01L 27/14831 257/222 |
| 2008/0179495 | A1* | 7/2008 | Shimizu | H01L 27/14603 250/208.1 |
| 2008/0231738 | A1 | 9/2008 | Iida | |
| 2008/0266431 | A1* | 10/2008 | Ohyama | G01S 7/481 348/294 |
| 2009/0032854 | A1* | 2/2009 | Nakashima | H01L 27/14603 257/292 |
| 2009/0134437 | A1* | 5/2009 | Nakashima | H01L 27/14806 257/292 |
| 2009/0134438 | A1* | 5/2009 | Arimoto | H01L 27/14806 257/292 |
| 2009/0144354 | A1* | 6/2009 | Misawa | H01L 27/14609 708/838 |
| 2009/0180018 | A1* | 7/2009 | Parks | H04N 3/1575 348/311 |
| 2009/0315086 | A1 | 12/2009 | Arimoto et al. | |
| 2010/0013975 | A1* | 1/2010 | Nakashima | H01L 27/14609 348/308 |
| 2010/0079652 | A1 | 4/2010 | Kanbe | |
| 2011/0086463 | A1* | 4/2011 | Mabuchi | H01L 27/14603 438/73 |
| 2011/0303822 | A1* | 12/2011 | Mayer | H01L 27/14603 250/208.1 |
| 2012/0112247 | A1* | 5/2012 | Cazaux | H01L 27/14609 257/222 |
| 2012/0119264 | A1* | 5/2012 | Cazaux | H01L 27/14609 257/222 |
| 2014/0299747 | A1* | 10/2014 | Tachino | H01L 27/14614 250/208.1 |

FOREIGN PATENT DOCUMENTS

| | | |
|---|---|---|
| JP | 2009-147049 A | 7/2009 |
| JP | 2009-147064 A | 7/2009 |

OTHER PUBLICATIONS

Written Opinion mailed Apr. 2, 2013 in a corresponding PCT application No. PCT/JP2013/000625 (and English translation).
Office Action mailed Feb. 18, 2014 in a corresponding Japanese application No. 2013-010518 (and English translation).

* cited by examiner

SOLID-STATE IMAGING DEVICE AND METHOD FOR DRIVING THE SAME

CROSS REFERENCE TO RELATED APPLICATION

The present disclosure is a U.S. national stage application of PCT/JP2013/000625 filed on Feb. 6, 2013 and is based on Japanese Patent Applications No. 2012-26446 filed on Feb. 9, 2012, and No. 2013-10518 filed on Jan. 23, 2013, the contents of which are incorporated herein by reference.

TECHNICAL FIELD

The present disclosure relates to a solid-state imaging device having a gate electrode to amplify an electric charge and a method for driving the same.

BACKGROUND ART

Solid-state imaging devices using semiconductors are known as image sensors such as CCD image sensors and CMOS image sensors. The image sensors increase the number of pixels to generate finer images. As a result, reducing a light receiving area per pixel might decrease the sensitivity.

To solve this problem, for example, Patent Document 1 proposes a solid-state imaging device having a gate electrode for avalanche multiplication between a photodiode portion to photoelectrically convert the incident light and a floating diffusion portion to convert an electric charge to a voltage.

The solid-state imaging device described in Patent Document 1 performs avalanche multiplication on an electric charge and stores multiplied electrons. The solid-state imaging device therefore includes multiple quantum well structures and gate electrodes corresponding to the multiplication and the storage. The solid-state imaging device also includes a gate electrode for transfer to move charges between the quantum wells. At least three gate electrodes to multiply electric charges are needed within a unit pixel. This caused the problem of increasing the pixel size and making it difficult to use a large number of pixels. The solid-state imaging device according to this configuration multiplies an electric charge between different quantum wells (different gate electrodes) and therefore increases the length of a path the electric charge travels. This makes it difficult to decrease a voltage applied to a multiplication gate electrode to acquire an electric field that enables the avalanche multiplication.

PRIOR ART LITERATURES

Patent Literature

[Patent Literature 1]
JP-A-2009-147064

SUMMARY OF INVENTION

It is an object of the present disclosure to miniaturize a pixel in a solid-state imaging device having a multiplication portion and decrease a voltage applied to a multiplication gate electrode.

According to a first aspect of the present disclosure, a solid-state imaging device includes: a plurality of pixels. Each pixel includes: a photoelectric conversion portion that has a second conductive type, is arranged in a surface layer portion of a surface of a semiconductor substrate having a first conductivity type, and converts light incident on the surface into an electric charge; a charge holding portion that has a second conductive type, stores the electric charge generated in the photoelectric conversion portion, and is arranged in the semiconductor substrate; a multiplication gate electrode that is capacitively coupled with the charge holding portion, and is arranged on the semiconductor substrate via an insulation film; and a charge barrier portion that is arranged between the charge holding portion and the insulation film at a position where the multiplication gate electrode and the charge holding portion are capacitively coupled, and has a first conductivity type with a higher impurity concentration than the semiconductor substrate.

The above configuration causes the charge barrier portion between the insulation film and the charge holding portion to form a region having a potential smaller than the interface between the semiconductor substrate and the insulation film and the charge holding portion. The charge holding portion exhibits a larger potential than the charge barrier portion and a region opposite the charge barrier portion with reference to the charge holding portion in the direction of arranging the insulation film, the charge barrier portion, and the charge holding portion. In other words, a potential well is formed. For this reason, the charge holding portion stores an electric charge generated from the photoelectric conversion portion. The insulation film and the charge barrier portion are provided between the multiplication gate electrode and the charge holding portion. If a predetermined voltage is applied to the multiplication gate electrode, the potential increases toward the insulation film in the direction of arranging the insulation film, the charge barrier portion, and the charge holding portion. An electric charge present in the charge holding portion accelerates toward the insulation film and increases in the charge barrier portion due to avalanche multiplication. It is possible to multiply an electric charge while storing the electric charge in the charge holding portion and applying a predetermined voltage to the multiplication gate electrode in terms of an impurity profile according to the invention in the direction of arranging the insulation film, the charge barrier portion, and the charge holding portion. The same electrode can store and multiply electric charges without forming another charge holding portion and multiplication gate electrode in different regions. It is possible to decrease the thickness of the charge barrier portion to accelerate and multiply an electric charge, that is, the distance needed for electric charge acceleration compared to a configuration of accelerating and multiplying electric charges between different electrodes. Accordingly, it is possible to reduce a voltage applied to the multiplication gate electrode in order to ensure an electric field capable of avalanche multiplication on electric charges.

According to a second aspect of the present disclosure, a method of driving the solid-state imaging device according to the first aspect includes: applying a clock pulse having a high bias and a low bias to the multiplication gate electrode; applying the low bias to the multiplication gate electrode during a storage period to store an electric charge in the charge holding portion; and applying at least the high bias to the multiplication gate electrode during a multiplication period to multiply the electric charge stored in the charge holding portion.

This drive method applies a low bias voltage to the multiplication gate electrode during the storage period and thereby enables the potential in the charge barrier portion to decrease compared to the charge holding portion. That is, the charge holding portion below the multiplication gate electrode can store an electric charge generated in the photoelectric conversion portion without moving the electric charge toward the surface of the semiconductor substrate. The method applies a high bias voltage to the multiplication gate electrode during the multiplication period and thereby enables the potential for the charge barrier portion to be larger than the charge holding portion while increasing the potential toward the insulation film. That is, the electric charge stored in the charge holding portion can be accelerated toward the insulation film. The avalanche multiplication can be used to increase the electric charge.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
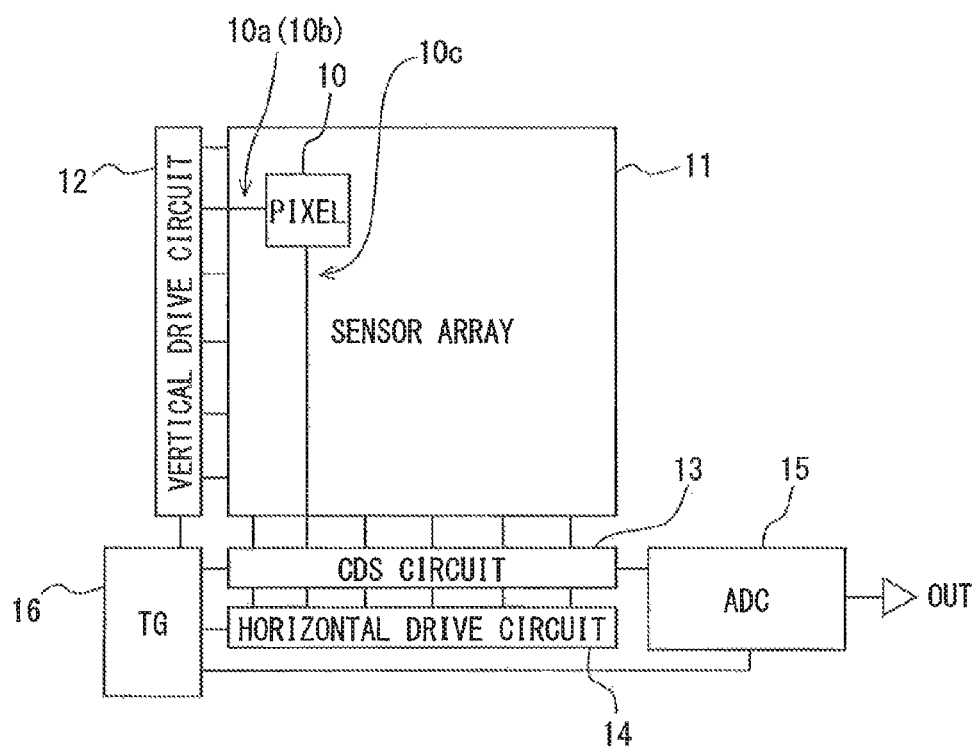
FIG. 1 schematically illustrates a configuration of a solid-state imaging device according to a first embodiment.

Embodiments of the present disclosure will be described with reference to the accompanying drawings. Hereinafter, the mutually corresponding parts in the drawings are designated by the same reference numerals.

(First Embodiment)

With reference to FIG. 1, the following describes a schematic configuration of the solid-state imaging device according to the embodiment.

The solid-state imaging device according to the embodiment configures a CMOS image sensor. As illustrated in FIG. 1, the solid-state imaging device includes a sensor array 11, a vertical drive circuit 12, a correlated double sampling (CDS) circuit 13, a horizontal drive circuit 14, an A/D converter circuit (ADC) 15, and a timing generator (TG) 16. The sensor array 11 includes multiple unit pixels (hereinafter simply referred to as pixels) arranged in a two-dimensional matrix.

The unit pixel 10 includes at least such constituent elements as a photoelectric conversion portion, a charge holding portion, a floating diffusion (FD) portion, and a reset drain (RD) portion. The photoelectric conversion portion photoelectrically converts the incident light to store an electric charge. The charge holding portion receives the electric charge from the photoelectric conversion portion and temporarily holds the electric charge. The FD portion receives the electric charge from the charge holding portion and converts the electric charge to a voltage. The RD portion resets the electric charge amount in the FD portion. According to the embodiment, the pixel 10 also includes a transfer means that transfers an electric charge from the photoelectric conversion portion to the charge holding portion and from the charge holding portion to the FD portion. A specific configuration of the unit pixel 10 will be described later.

A row transfer line 10a and a row selection line 10b connect the vertical drive circuit 12 with each pixel 10. The vertical drive circuit 12 selects each pixel 10 in the sensor array 11 in units of rows as read rows. The row transfer line 10a includes multiple signal lines and supplies the sensor array 11 with a drive signal that transfers or resets a signal generated from the photoelectric conversion portion to be described. The row selection line 10b supplies the sensor array 11 with a signal to be selected as a read row.

The CDS circuit 13 is arranged for one or more pixel rows in the sensor array 11 and performs CDS processing on a signal read from the row selected by the vertical drive circuit 12. Specifically, the CDS circuit 13 receives a reset level and a signal level from each pixel 10 and finds a difference between both levels to remove a fixed pattern noise for each pixel 10.

The horizontal drive circuit 14 is connected to each pixel 10 via the CDS circuit 13 through a column signal line 10c. The horizontal drive circuit 14 sequentially selects signals that are CDS-processed in the CDS circuit 13 and are stored on a column basis. After the horizontal drive circuit 14 selects signals for the columns, the ADC 15 converts the signals into digital signals and outputs them.

The TG 16 generates various timing signals to drive the vertical drive circuit 12, the CDS circuit 13, the horizontal drive circuit 14, and the ADC 15.

Figure 2:
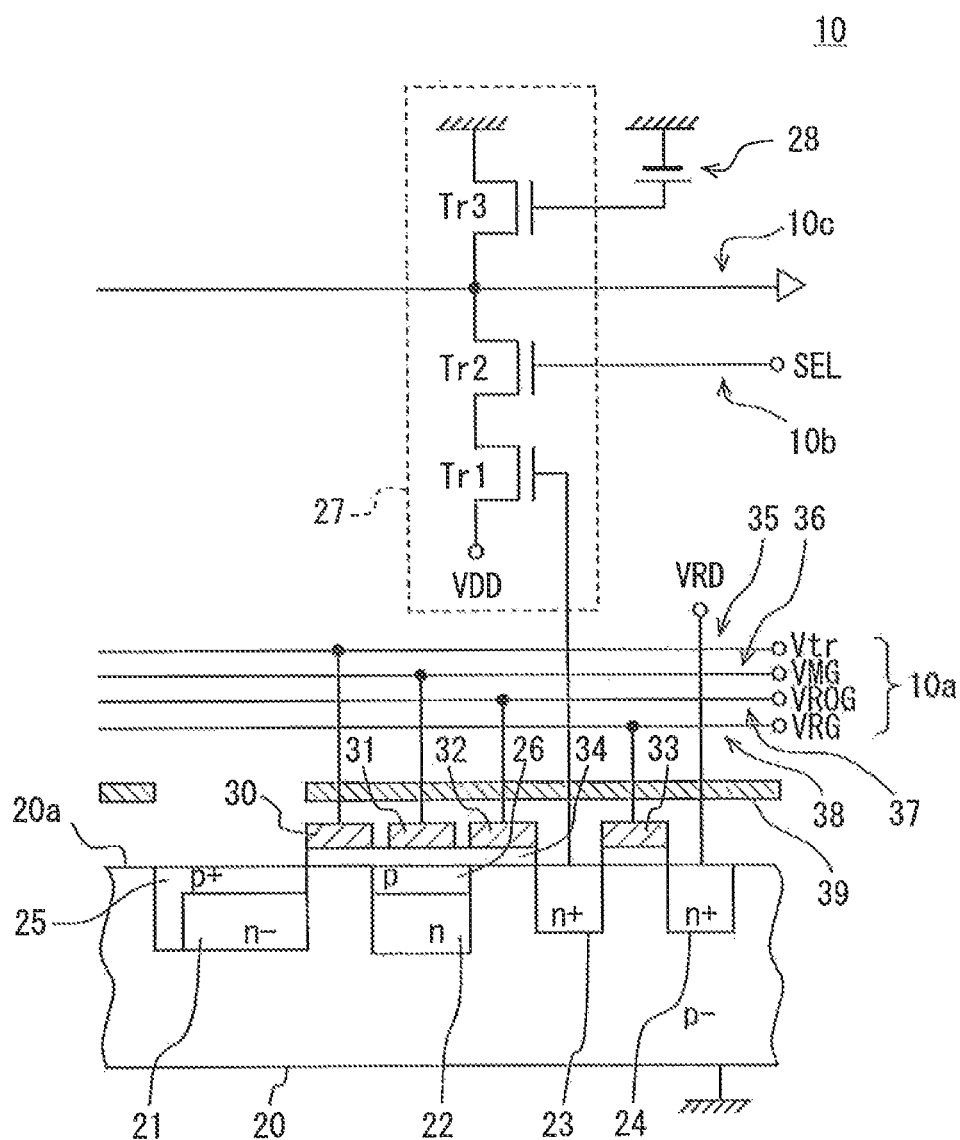
FIG. 2 is a cross sectional view of a pixel taken along line II-II of FIG. 3 and schematically illustrates a configuration of the pixel.

With reference to FIG. 2, the following describes a schematic configuration of the unit pixel 10 according to the embodiment.

As illustrated in FIG. 2, the unit pixel 10 includes a photoelectric conversion portion 21, a charge holding portion 22, an FD portion 23, and an RD portion 24 on a surface 20a of a P-type (p−) semiconductor substrate 20. According to the embodiment, the portions 21, 22, 23, and 24 are formed separately from each other and adjacently arranged in this order. The embodiment supplies the semiconductor substrate 20 with a ground potential.

The photoelectric conversion portion 21 is available as N-type (n−) doped with impurities such as phosphorus. The impurity concentration can be set to $5.0 \times 10^{16}$ cm$^{-3}$, for example. The light incident on the photoelectric conversion portion 21 is converted to an electric charge due to photoelectric conversion. According to the embodiment, an electric charge generated by photoelectric conversion signifies an electron. A hole accumulation layer 25 is formed between the photoelectric conversion portion 21 and the surface 20a. The hole accumulation layer 25 is available as P-type (p+) whose impurity concentration is higher than the semiconductor substrate 20. That is, the hole accumulation layer 25 is exposed from the surface 20a. The photoelectric conversion portion 21 is formed deeper than the hole accumulation layer 25 in the thickness direction of the semiconductor substrate 20.

Doped with impurities such as phosphorus, the charge holding portion 22 is available as N-type (n) whose concentration is higher than the photoelectric conversion portion 21. The impurity concentration can be specified as $1.0 \times 10^{17}$ cm$^{-3}$, for example. Therefore, the charge holding portion 22 exhibits a larger potential than the semiconductor substrate 20 (P-type region) surrounding the charge holding portion 22. According to the embodiment, the charge holding portion 22 is formed separately from the photoelectric conversion portion 21. A transfer means to be described later transfers an electric charge generated in the photoelectric conversion portion 21 to the charge holding portion 22. Thereafter, the charge holding portion 22 temporarily holds the electric charge. A charge barrier portion 26 is formed between the charge holding portion 22 and the surface 20a adjacently to the charge holding portion 22. The charge barrier portion 26 is exposed from the surface 20a. The charge holding portion 22 is formed deeper than the charge barrier portion 26 in the thickness direction of the semiconductor substrate 20. According to the embodiment, an interface between the charge holding portion 22 and the charge barrier portion 26 is formed to be approximately 0.2 µm distant from the surface 20a. The charge barrier portion 26 is available as P-type (p) whose impurity concentration is higher than the semiconductor substrate 20. The impurity concentration of the charge barrier portion 26 is favorably specified to be higher than or equal to $1.5 \times 10^{17}$ cm-3 and lower than or equal to $3.0 \times 10^{18}$ cm$^{-3}$. According to the embodiment, the impurity concentration is specified as $3.0 \times 10^{17}$ cm$^{-3}$. The charge barrier portion 26 is specific to the present disclosure. The charge barrier portion 26 causes a potential in the thickness direction of the semiconductor substrate 20 to be shaped into a quantum well whose base corresponds to the charge holding portion 22. Specific working effects of the charge barrier portion 26 will be described later.

Doped with impurities such as phosphorus, the FD portion 23 is available as N-type (n+) whose concentration is higher than the charge holding portion 22. The FD portion 23 is provided separately from the photoelectric conversion portion 21 and the charge holding portion 22. A source follower circuit 27 is connected to the FD portion 23. The source follower circuit 27 according to the embodiment includes three transistors Tr1, Tr2, and Tr3 connected in series. The gate of the transistor Tr1 is connected to the FD portion 23. The drain is connected to a power supply potential (VDD in FIG. 2). The row selection line 10b connects the gate of the transistor Tr2 to the vertical drive circuit 12. The drain is connected to the source of the transistor Tr1. The row selection line 10b connected to the gate of the transistor Tr2 is supplied with a dock pulse (SEL in FIG. 2) that controls an on/off-state of the transistor Tr2. The gate of the transistor Tr3 is connected to a constant voltage source 28. The drain is connected to the source of the transistor Tr2. The source of the transistor Tr3 is grounded. That is, the transistor Tr3 functions as a constant current source. The column signal line 10c is connected to the source of the transistor Tr2, that is, the drain of the transistor Tr3.

An electric charge transferred from the charge holding portion 22 changes the electric potential of the FD portion 23. The transistor Tr2 turns on if a specified voltage is applied to the row selection line 10b (targeted to read signals). An electric current corresponding to a change in the electric potential of the FD portion 23 flows through the column signal line 10c. The transistor Tr2 turns off if no specified voltage is applied to the row selection line 10b. In this state, there is no change in the current that flows through the column signal line 10c due to a change in the electric potential of the FD portion 23.

Doped with impurities such as phosphorus, the RD portion 24 is available as N-type (n+) whose concentration approximately equals the FD portion 23. The RD portion 24 is provided separately from the photoelectric conversion portion 21, the charge holding portion 22, and the FD portion 23. The RD portion 24 is connected to the constant voltage source (VRD in FIG. 2) to provide a specified electric potential. According to the embodiment, VRD is supplied from the same power supply as VDD. A reset operation to be described later sweeps an electric charge stored in the FD portion 23 away to the RD portion 24. The FD portion 23 maintains the same electric potential as the RD portion 24.

The unit pixel 10 includes multiple gate electrodes so that the vertical drive circuit 12 performs on/off operation at specified timings. Specifically, the unit pixel 10 includes a transfer gate electrode 30, a multiplication gate electrode 31, a read gate (ROG) electrode 32, and a reset gate (RG) electrode 33. According to the embodiment, the gate electrodes 30, 31, 32, and 33 use N-type polysilicon doped with impurities.

The transfer gate electrode 30 is formed via an insulation film 34 over a region between the photoelectric conversion portion 21 and the charge holding portion 22 on the surface 20a of the semiconductor substrate 20. The transfer gate electrode 30 connects with a transfer wire 35 included in the row transfer line 10a and is supplied with a clock pulse (Vtr in FIG. 2) from the vertical drive circuit 12.

The multiplication gate electrode 31 is capacitively coupled so as to at least partially overlap the charge holding portion 22 and is formed over the surface 20a of the semiconductor substrate 20 via the insulation film 34. The multiplication gate electrode 31 connects with a multiplication gate wire 36 included in the row transfer line 10a and is supplied with a dock pulse (VMG in FIG. 2) from the vertical drive circuit 12.

The ROG electrode 32 is formed via the insulation film 34 over a region between the charge holding portion 22 and the FD portion 23 on the surface 20a of the semiconductor substrate 20. The ROG electrode 32 connects with a read gate (ROG) wire 37 included in the row transfer line 10a and is supplied with a dock pulse (VROG in FIG. 2) from the vertical drive circuit 12.

The RG electrode 33 is formed via the insulation film 34 over a region between the FD portion 23 and the RD portion 24 on the surface 20a of the semiconductor substrate 20. The RG electrode 33 connects with a reset gate (RG) wire 38 included in the row transfer line 10a and is supplied with a dock pulse (VRG in FIG. 2) from the vertical drive circuit 12.

According to the embodiment, the pixel 10 includes a light shielding film 39 to block off the light. The light shielding film 39 is formed over a region except the photoelectric conversion portion 21 for photoelectric conversion using the incident light on the surface 20a of the semiconductor substrate 20. The light shielding film 39 is made of aluminum, for example. The light shielding film 39 is formed to cover the sensor array 11 and has a hole corresponding to the photoelectric conversion portion 21 and the hole accumulation layer 25.

The unit pixel 10 is electrically separated from another unit pixel 10 via an element isolation region (not shown). The element isolation region may be available as an insulation film (e.g., an oxide film due to LOCOS oxidation) or a P-type impurity region whose concentration is higher than the semiconductor substrate 20 and the charge barrier portion 26.

Figure 3:
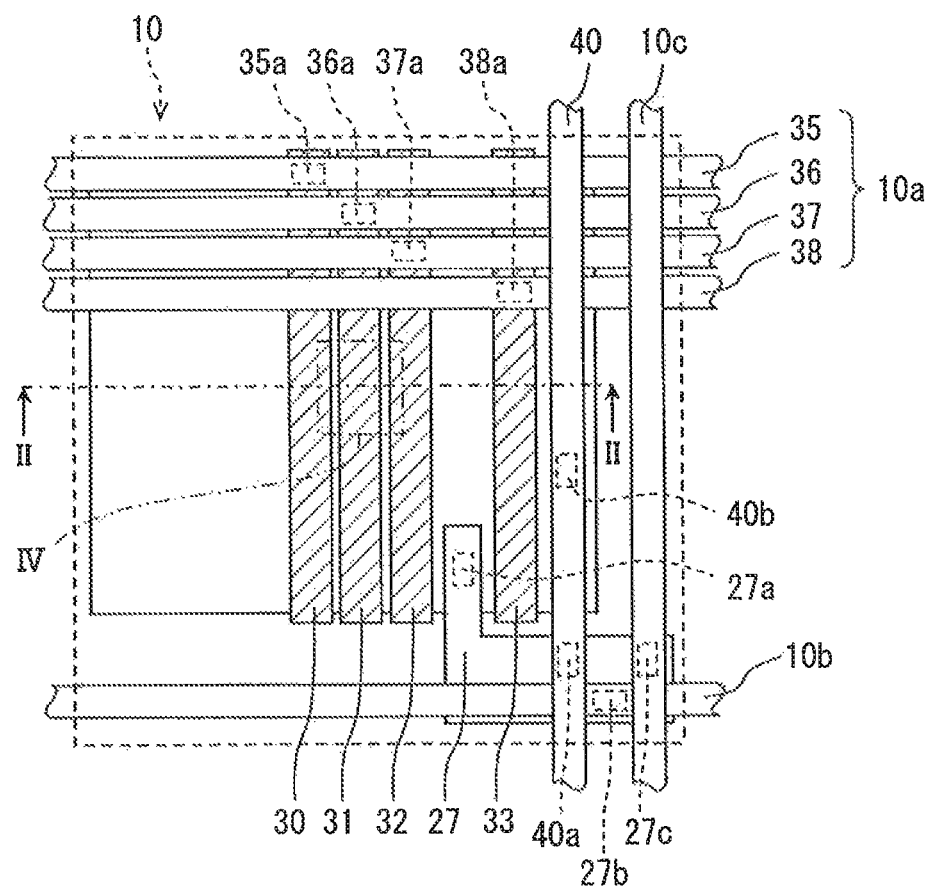
FIG. 3 is a top view exemplifying a pixel layout.
Figure 4:
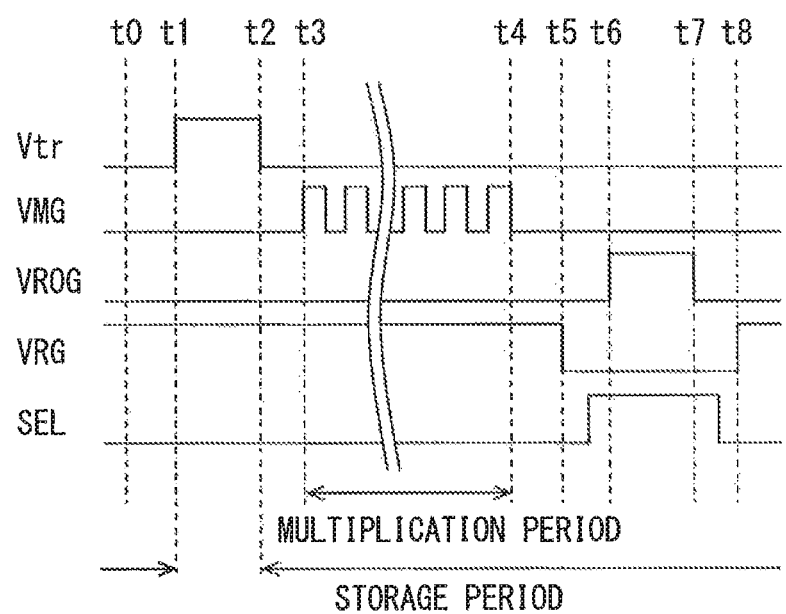
FIG. 4 is a timing chart that exemplifies timings to drive the solid-state imaging device.

With reference to FIGS. 3 and 4, the following describes a specific layout configuration of the unit pixel 10 according to the embodiment.

As illustrated in FIG. 3, the unit pixel 10 includes the transfer gate electrode 30, the multiplication gate electrode 31, the ROG electrode 32, and the RG electrode 33 that are adjacently arranged in this order. The row transfer line 10a is formed to supply the gate electrodes 30, 31, 32, and 33 with the dock pulses (Vtr, VMG, VROG, and VRG). Specifically, in the row transfer line 10a, the transfer wire 35 is connected to the transfer gate electrode 30 via a contact 35a. The multiplication gate wire 36 is connected to the multiplication gate electrode 31 via a contact 36a. The ROG wire 37 is connected to the ROG electrode 32 via a contact 37a. The RG wire 38 is connected to the RG electrode 33 via a contact 38a.

A peripheral circuit including the source follower circuit 27 is formed over the semiconductor substrate 20 and is connected to the FD portion 23 via a contact 27a. The source follower circuit 27 is also connected to the row selection line 10b via a contact 27b. The source follower circuit 27 is also connected to the column signal line 10c and a power supply potential line 40 via a contact 27c and a contact 40a, respectively. According to the embodiment, the power supply potential line 40 is also connected to the RD portion 24 via a contact 40b. The RD portion 24 is omitted from FIG. 3.

According to the embodiment, the row transfer line 10a and the row selection line 10b are formed to extend in the direction of adjacently arranging the gate electrodes 30, 31, 32, and 33 and connect with the vertical drive circuit 12. The column signal line 10c and the power supply potential line 40 extend in the direction perpendicular to the row transfer line 10a and the row selection line 10b and connect with the horizontal drive circuit 14.

According to the embodiment, as illustrated in FIG. 2, the multiplication gate electrode 31 is formed to overlap only part of the charge barrier portion 26. Specifically, the multiplication gate electrode 31 is narrower than the charge barrier portion 26 in the direction of adjacently arranging the gate electrodes 30, 31, 32, and 33. The charge barrier portion 26 is exposed to the region between the multiplication gate electrode 31 and the transfer gate electrode 30 and the region between the multiplication gate electrode 31 and the ROG electrode 32 over the surface 20a of the semiconductor substrate 20.

With reference to FIGS. 4 through 11, the following describes a method of driving the solid-state imaging device according to the embodiment.

FIG. 4 illustrates an example timing chart to drive the solid-state imaging device according to the embodiment. The horizontal axis corresponds to the time. The timing chart chronologically shows states of clock pulses (Vtr, VMG, VROG, and VRG) and a clock pulse (SEL) that is applied to the row selection line 10b to control on/off operation of the transistor Tr2. That is, the timing chart shows that a high bias voltage or a low bias voltage is applied to each gate electrode at a given timing. According to the embodiment, clock pulses Vtr, VROG, and VRG are applied to the gate electrodes 30, 32, and 33 for electric charge transfer and are assumed to range between a high bias voltage of approximately 3.3 V and a low bias voltage of 0 V (ground electric potential). Clock pulse VMG is applied to the multiplication gate electrode 31 for electric charge multiplication and is assumed to range between a high bias voltage of approximately 5 V and a low bias voltage of 0 V. Clock pulse SEL is assumed to range between a high bias voltage sufficient to turn on the transistor Tr2 of the source follower circuit 27 and a low bias voltage of 0 V. The following describes how the solid-state imaging device is driven at each timing.

Figure 5:
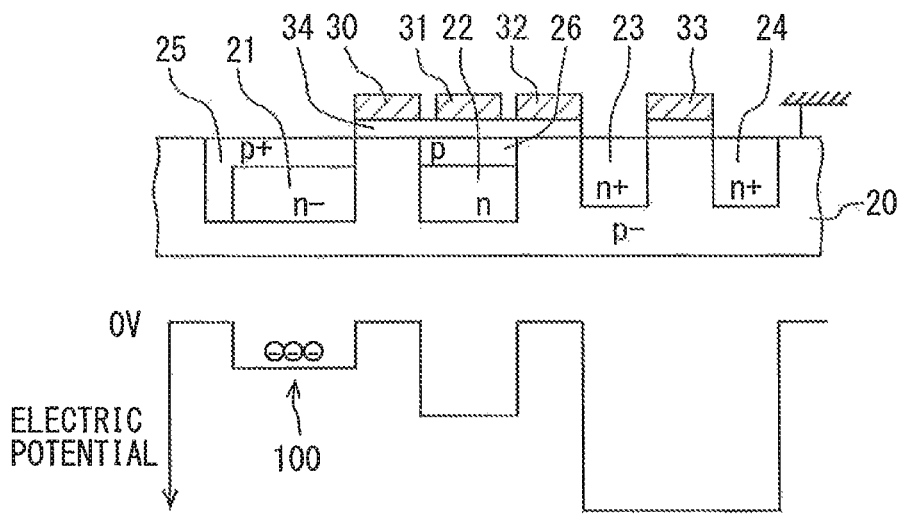
FIG. 5 is a potential chart illustrating electric potential shapes for the pixel in a direction perpendicular to a thickness direction of a semiconductor substrate.

At timing t0, as illustrated in FIG. 4, dock pulses Vtr, VMG, VROG, and SEL are set to low bias and dock pulse VRG is set to high bias. The photoelectric conversion portion 21, the charge holding portion 22, the FD portion 23, and the RD portion 24 cause the respective potentials in the direction of adjacently arranging the gate electrodes to be shaped to reflect differences in the impurity concentrations of the portions. As illustrated in FIG. 5, the charge holding portion 22 provides a larger potential (higher electric potential) than the photoelectric conversion portion 21. The FD portion 23 provides a larger potential than the charge holding portion 22. The RD portion 24 provides a potential approximately equal to the FD portion 23. At timing t0, the region immediately below the transfer gate electrode 30 and the ROG electrode 32 causes a potential approximately equal to the ground electric potential. Accordingly, the photoelectric conversion portion 21 and the charge holding portion 22 are electrically separated. On the other hand, a potential immediately below the RG electrode 33 is large because VRG is set to high bias. Accordingly, the FD portion 23 and the RD portion 24 are electrically connected to cause the same electric potential. An electric potential for the region immediately below the transfer gate electrode 30 approximates to the ground electric potential, forming a quantum well whose base corresponds to the photoelectric conversion portion 21. Accordingly, the photoelectric conversion portion 21 stores a signal charge 100 generated from photoelectric conversion of the incident light.

As illustrated in FIG. 4, Vtr goes to high bias from low bias at timings between t1 and t2. In this state, the region immediately below the transfer gate electrode 30 causes a large potential (high electric potential). The signal charge 100 stored in the photoelectric conversion portion 21 is transferred to the charge holding portion 22 due to fringe electric field drift and self-induction drift.

Figure 6:
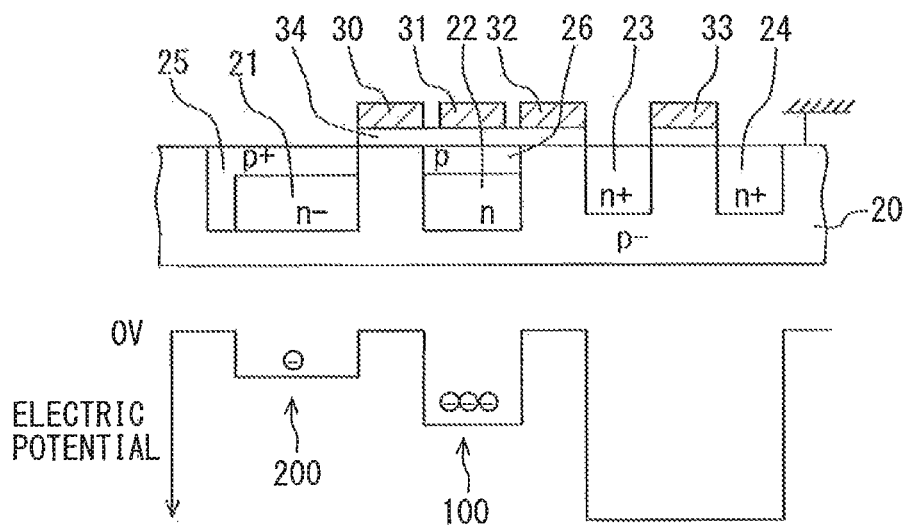
FIG. 6 is a potential chart illustrating electric potential shapes for the pixel in a direction perpendicular to a thickness direction of a semiconductor substrate.

At timing t2, Vtr goes to low bias from high bias. As illustrated in FIG. 6, this causes the potential immediately below the transfer gate electrode 30 to approximately equal the ground electric potential. The photoelectric conversion portion 21 and the charge holding portion 22 form quantum wells electrically separated from the other portions. The charge holding portion 22 holds the signal charge 100 transferred from the photoelectric conversion portion 21. The photoelectric conversion portion 21 starts storing a new signal charge 200 due to photoelectric conversion of the incident light into an electric charge. That is, a storage period described in the scope of claims starts when Vtr goes low.

Figure 7:
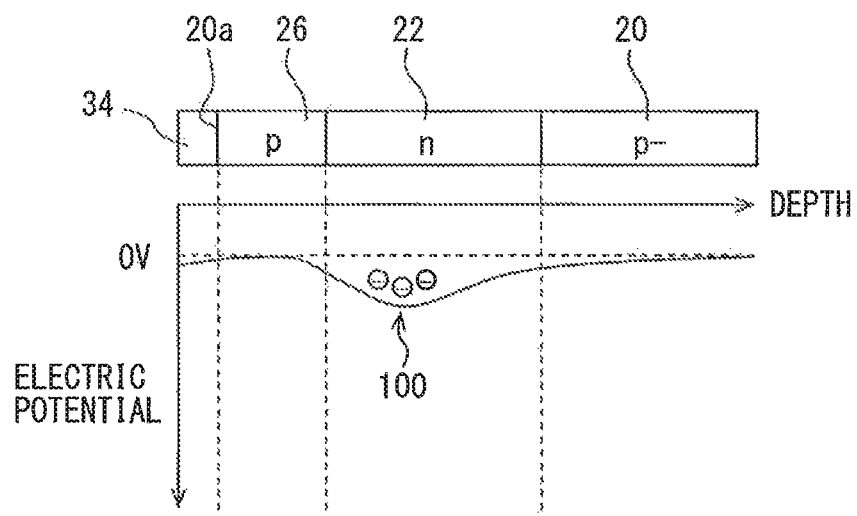
FIG. 7 is a potential chart illustrating electric potential shapes for the pixel in a thickness direction of a semiconductor substrate.

The charge barrier portion 26 is exposed from the surface 20a of the semiconductor substrate 20 between the charge holding portion 22 and the insulation film 34. As illustrated in FIG. 7, the potential in the thickness direction of the semiconductor substrate 20 approximately equals the ground electric potential corresponding to the insulation film 34 and the charge barrier portion 26. The potential corresponding to the charge holding portion 22 is larger (positive electric potential) than the charge barrier portion 26. The potential decreases (approximates to the ground electric potential) with distance from the surface 20a in the thickness direction of the semiconductor substrate 20. That is, the potential is shaped into a quantum well whose base corresponds to the charge holding portion 22. The charge holding portion 22 holds the signal charge 100 in the thickness direction of the semiconductor substrate 20, also. The embodiment uses N-type polysilicon for the multiplication gate electrode 31. An interface between the insulation film 34 and the multiplication gate electrode 31 causes a slightly positive electric potential.

Figure 8:
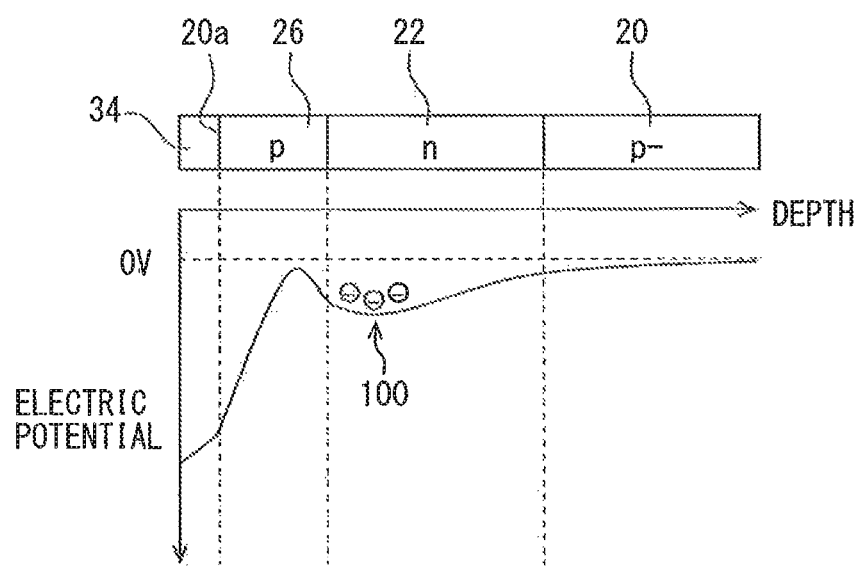
FIG. 8 is a potential chart illustrating electric potential shapes for the pixel in a thickness direction of a semiconductor substrate.
Figure 9:
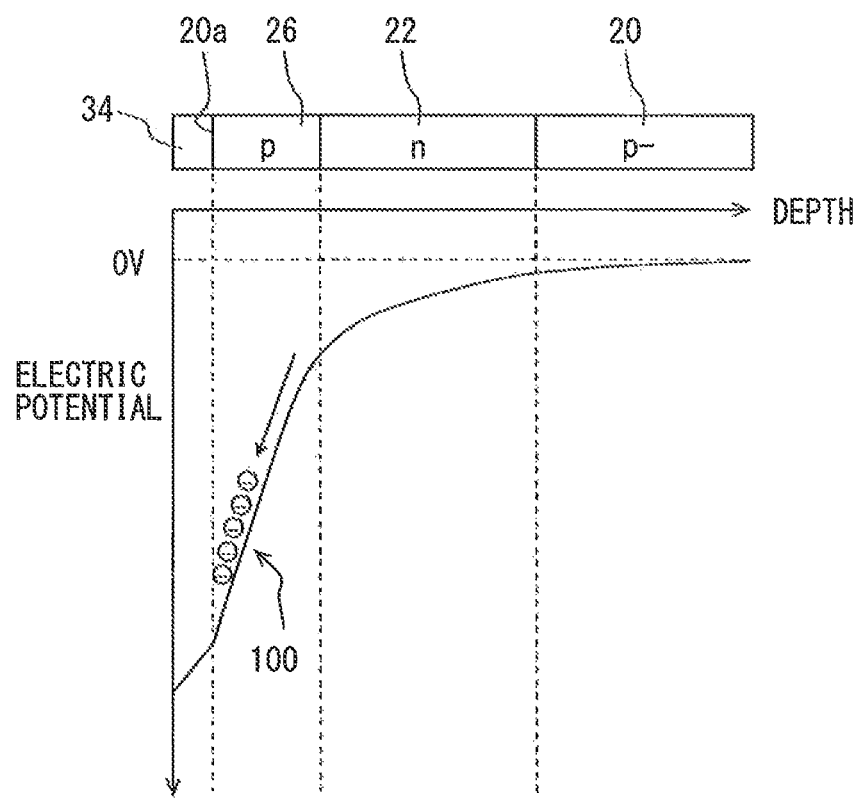
FIG. 9 is a potential chart illustrating electric potential shapes for the pixel in a thickness direction of a semiconductor substrate.

As illustrated in FIG. 4, dock pulse VMG is applied so as to contain multiple high bias voltages between timings t3 and t4. The dock pulse includes a single pulse that goes to low-high-low bias. With reference to FIGS. 7 through 9, the following describes in detail how the solid-state imaging device is driven when that pulse is applied to the multiplication gate electrode 31.

When VMG is low, the charge holding portion 22 holds the signal charge 100 as described above (FIG. 7).

When VMG transitions into high bias from low bias thereafter, the surface 20a of the semiconductor substrate 20 deepens the potential (to increase the electric potential) as illustrated in FIG. 8. The charge barrier portion 26 can keep the potential smaller than that of the charge holding portion 22. An electric field capable of avalanche multiplication on electric charges is available in a region toward the surface 20a rather than a potential barrier formed in the charge barrier portion 26.

When VMG goes to high bias as illustrated in FIG. 9, the charge barrier portion 26 allows the potential to be larger than the charge holding portion 22. The signal charge 100 stored in the charge holding portion 22 accelerates toward the surface 20a. This enables avalanche multiplication on the signal charge 100.

When VMG transitions into low bias from high bias thereafter, the potential of the semiconductor substrate 20 in the thickness direction is shaped similarly to the transition state (FIG. 8) in which VMG transitions into high bias from low bias. At this time, the signal charge 100 exists toward the surface 20a rather than the potential barrier formed in the charge barrier portion 26.

When VMG goes to low bias thereafter, the electric potential in the insulation film 34 and the charge barrier portion 26 approximates to the ground electric potential and is shaped into a quantum well whose base corresponds to the charge holding portion 22 as illustrated in FIG. 7. The signal charge 100 is transferred to the charge holding portion 22 from the region toward the surface 20a rather than the charge barrier portion 26 due to fringe electric field drift and self-induction drift.

As described above, changing VMG from low bias to high bias enables avalanche multiplication on the signal charge 100 stored in the charge holding portion 22. Changing VMG from high bias to low bias allows the charge holding portion 22 to hold the multiplied signal charge 100 again.

Between timings t3 and t4, applying multiple high bias voltages as VMG can multiply an electric charge resulting from the photoelectric conversion. This period (t4-t3) corresponds to a multiplication period described in the scope of claims.

Figure 10:
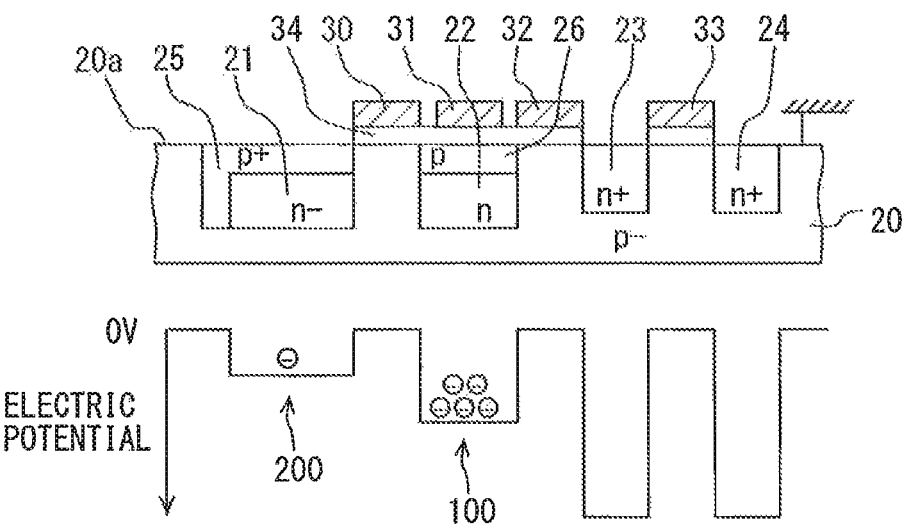
FIG. 10 is a potential chart illustrating electric potential shapes for the pixel in a direction perpendicular to a thickness direction of a semiconductor substrate.

At timing t5, VRG goes to low bias from high bias. As illustrated in FIG. 10, this decreases the potential in the region immediately below the RG electrode 33 and allows the electric potential to approximate to the ground electric potential. At timing t5, VROG also goes low. The FD portion 23 is electrically separated from the charge holding portion 22 and the RD portion 24. That is, the FD portion 23 forms a quantum well.

Clock pulse SEL is applied to the row selection line 10b and goes to high bias from low bias between timings t5 and t6. This turns on the transistor Tr2 of the source follower circuit 27 and enables to vary a current flowing through the column signal line 10c according to a change in the gate voltage for the transistor Tr1 connected to the FD portion 23.

Figure 11:
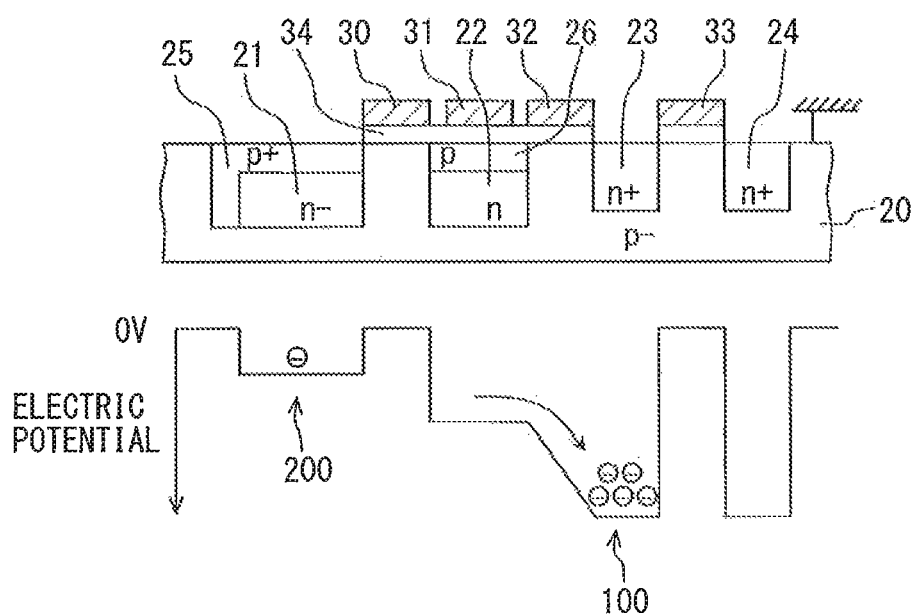
FIG. 11 is a potential chart illustrating electric potential shapes for the pixel in a direction perpendicular to a thickness direction of a semiconductor substrate.

Between timings t6 and t7, VROG goes to high bias from low bias. As illustrated in FIG. 11, this increases the potential immediately below the ROG electrode 32 and transfers the signal charge 100 stored in the charge holding portion 22 to the FD portion 23. The FD portion 23 stores the signal charge 100 to change the gate voltage for the transistor Tr1 connected to the source follower circuit 27. Specifically, the electric potential for the FD portion 23, that is, the gate voltage for the transistor Tr1 decreases compared to that before the signal charge 100 is stored. Between timings t6 and t7, SEL remains high bias. Decreasing the electric potential for the FD portion 23 decreases the current flowing through the column signal line 10c. A decrease in the amount of current depends on the amount of signal charge 100 transferred to the FD portion 23. This signifies that the amount of light incident on the pixel 10 is converted to a decrease in the amount of the current flowing through column signal line 10c.

At timing t7, VROG goes low. The FD portion 23 is thereby shaped into a quantum well, again. At timing t7, the FD portion 23 holds the signal charge 100.

Between timings t7 and t8, SEL goes to low bias from high bias. This prevents a change in the electric potential of the FD portion 23 from affecting the column signal line 10c.

At timing t8, RG goes to high bias from low bias. This sweeps the signal charge 100 held in the FD portion 23 away to the RD portion 24. The FD portion 23 maintains the same electric potential (VRD) as the RD portion. The potential shape in the semiconductor substrate 20 at timing t8 equals that at timing t0.

Repeating the operation from timings t0 through t8 can successively output a voltage signal corresponding to the light incident on the sensor array 11. The photoelectric conversion portion 21 converts the light to an electric charge and stores it during a period in which Vtr goes to low bias from high bias at timing t2, passes through timing t8, and goes to high bias from low bias at timing t1. The period corresponds to a storage period described in the scope of claims.

The following describes working effects of the solid-state imaging device according to the embodiment.

According to the embodiment, the charge barrier portion 26 is formed on the surface 20a of the semiconductor substrate 20. The charge holding portion 22 is formed adjacently to and deeper than the charge barrier portion 26 from the surface 20a. The potential in the thickness direction of the semiconductor substrate 20 is shaped into a quantum well when clock pulse VMG set to low bias is applied to the multiplication gate electrode 31. The base of the quantum well corresponds to the charge holding portion 22. The barrier thereof corresponds to the charge barrier portion 26 and a region of the semiconductor substrate 20 deeper than the charge holding portion 22. When an electric charge is transferred to the charge holding portion 22, the charge holding portion 22 can store the electric charge without moving it toward the surface 20a of the semiconductor substrate 20. As described above, when VMG transitions into high bias from low bias, the charge barrier portion 26 can form an electric field capable of avalanche multiplication on the electric charge while the charge holding portion 22 holds the electric charge. Setting VMG to high bias can accelerate and multiply the electric charge in the thickness direction of the semiconductor substrate 20. That is, the same electrode can store and multiply electric charges. This can decrease the number of gate electrodes compared to the technology described in the Patent Document 1 that accelerates an electric charge for multiplication in a direction perpendicular to the thickness direction. In other words, the surface 20a of the semiconductor substrate 20 can eliminate an area for regions needed for operation to multiply electric charges. As a result, the unit pixel 10 can be miniaturized.

According to the embodiment, the same electrode, that is, the multiplication gate electrode 31 can store and multiply an electric charge. The embodiment can shorten the distance needed for electric charge acceleration compared to the configuration described in the Patent Document 1 that accelerates and multiplies an electric charge between different electrodes. The embodiment can increase an electric field even if the electric charge is accelerated using the same electric potential difference. In other words, it is possible to decrease a voltage (high bias for VMG) applied to the multiplication gate electrode 31 to acquire an electric field needed for the avalanche multiplication compared to the configuration that accelerates and multiplies an electric charge between different electrodes. The configuration according to the embodiment can set a high bias voltage for VMG to approximately 5 V through 8 V. The embodiment can greatly decrease a voltage (15 V or more) for the multiplication gate electrode as described in the Patent Document 1.

Figure 12:
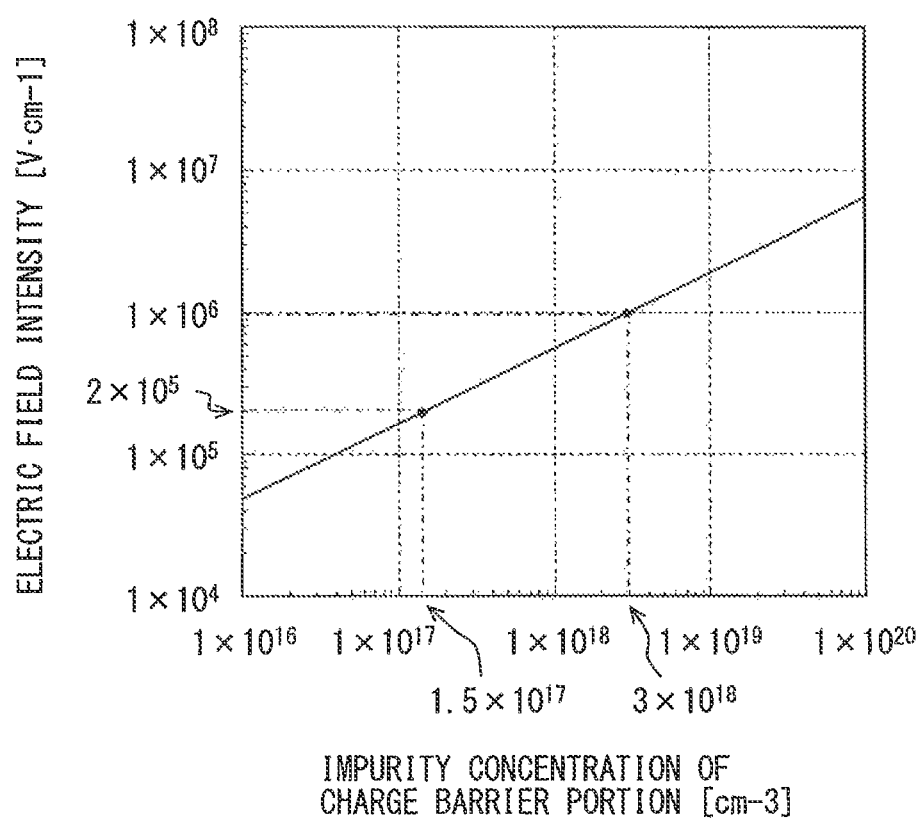
FIG. 12 illustrates the dependence of the maximum electric field intensity in a charge barrier portion on Impurity concentration in the charge barrier portion.

According to the embodiment, as described above, the impurity concentration of the charge barrier portion 26 is favorably specified to be higher than or equal to $1.5 \times 10^{17}$ $cm^{-3}$ and lower than or equal to $3.0 \times 10^{18}$ $cm^{-3}$. The inventors found the concentration range using computer simulation. Specifically, as illustrated in FIG. 12, we simulated dependence of the electric field intensity for the charge barrier portion 26 of the semiconductor substrate 20 on the impurity concentration. The electric field intensity corresponding to the vertical axis represents a maximum electric field in the thickness direction of the semiconductor substrate 20 including the charge barrier portion 26. The impurity concentration corresponding to the horizontal axis represents the impurity concentration of boron doped into the charge barrier portion 26. The electric field intensity increases as the impurity concentration increases. An electric field needed for avalanche multiplication on electric charges is $2 \times 10^5 V \cdot cm^{-1}$ or more. An electric field of $1 \times 10^6 V \cdot cm^{-1}$ or less prevents a tunnel breakdown from the charge barrier portion 26 to the insulation film 34 formed between the charge barrier portion 26 and the multiplication gate electrode 31. The electric field for the charge barrier portion 26 is favorably set to the above-mentioned range. This electric field range provides a favorable concentration range of larger than or equal to $1.5 \times 10^{17}$ $cm^{-3}$ and smaller than or equal to $3.0 \times 10^{18}$ $cm^{-3}$. We conducted the simulation under the condition that an interface between the charge holding portion 22 and the charge barrier portion 26 is formed at a distance of approximately 0.2 μm from the surface 20a. If the charge barrier portion 26 inverts strongly, the maximum electric field almost does not depend on the distance of the interface between the charge holding portion 22 and the charge barrier portion 26 from the surface 20a. The favorable concentration range (larger than or equal to $1.5 \times 10^{17}$ $cm^{-3}$ and smaller than or equal to $3.0 \times 10^{18}$ $cm^{-3}$) is not limited to the 0.2 μm distance of the interface between the charge holding portion 22 and the charge barrier portion 26 from the surface 20a.

According to the embodiment, the photoelectric conversion portion 21 and the charge holding portion 22 are formed separately from each other. The transfer gate electrode 30 is formed via the insulation film 34 corresponding to a region between the photoelectric conversion portion 21 and the charge holding portion 22 formed on the surface 20a of the semiconductor substrate 20.

A voltage applied to the transfer gate electrode 30 can control transfer of an electric charge to the charge holding portion 22 from the photoelectric conversion portion 21. Specifically, when Vtr is applied to the transfer gate electrode 30, setting Vtr to high bias can transfer an electric charge from the photoelectric conversion portion 21 to the charge holding portion 22. Setting Vtr to low bias can electrically separate the charge holding portion 22 from the photoelectric conversion portion 21. The charge holding portion 22 and the FD portion 23 are also electrically separated if a low bias voltage is applied to the ROG electrode 32 formed between the charge holding portion 22 and the FD portion 23. This configuration can temporarily store an electric charge photoelectrically converted by the photoelectric conversion portion 21 and then output the signal charge 100 as a voltage in a predetermined sequence. The multiple pixels 10 can be simultaneously exposed to enable global exposure.

Figure 13:
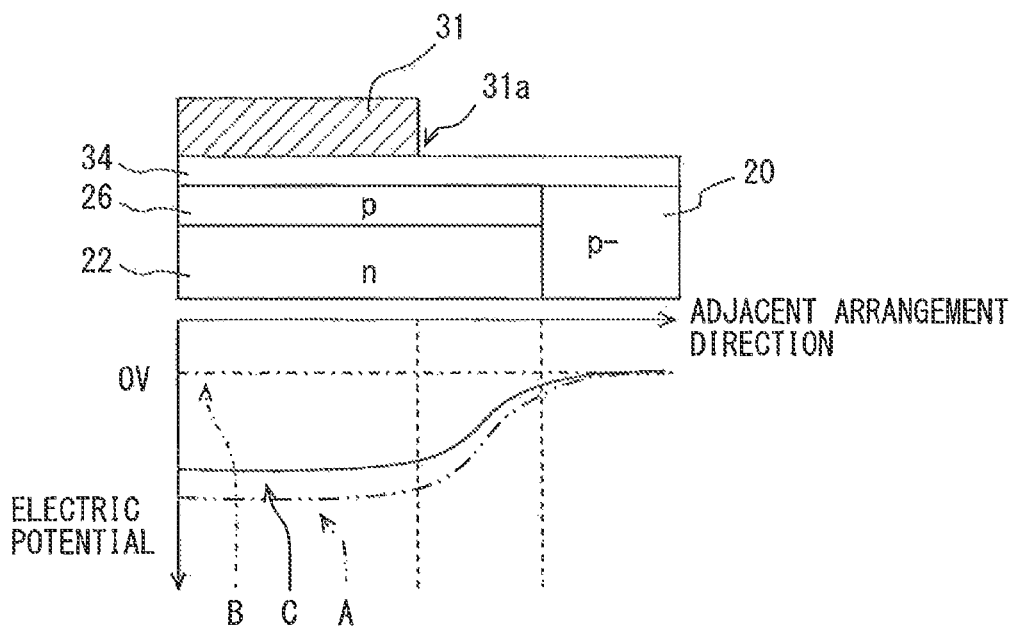
FIG. 13 is a partially enlarged cross sectional view along the line II-II of FIG. 2 and illustrates a potential chart.

According to the embodiment, the charge barrier portion 26 is formed to only partially overlap with the multiplication gate electrode 31. In other words, the charge barrier portion 26 is exposed from the surface 20a of the semiconductor substrate 20 except the part of the charge barrier portion 26 overlapping with the multiplication gate electrode 31. That is, as illustrated in FIG. 13, at least one edge 31a of the multiplication gate electrode 31 is positioned to the side of the charge barrier portion 26 rather than the boundary between the charge barrier portion 26 and the semiconductor substrate 20. This configuration can prevent occurrence of a potential dip near the interface between the charge barrier portion 26 and the semiconductor substrate 20 during a state of transition from low bias to high bias for dock pulse VMG applied to the multiplication gate electrode 31 in order to multiply an electric charge.

Figure 14:
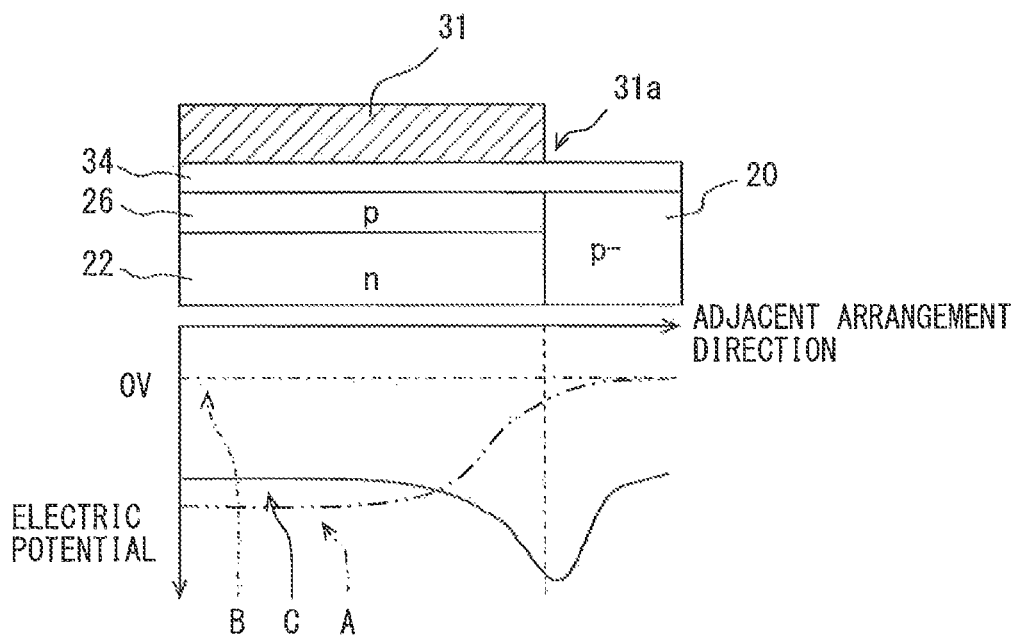
FIG. 14 is a partially enlarged cross sectional view along the line II-II of FIG. 2 and illustrates a potential chart.

The effect will be described with reference to FIGS. 13 and 14. In FIGS. 13 and 14 to illustrate potentials, dash-double dot line A represents a potential for the charge holding portion 22. Dash-dot line B represents a potential for the charge barrier portion 26 when VMG is set to low bias. Solid line C represents a potential for the charge barrier portion 26 during a transition state in which VMG goes to high bias.

When a voltage is applied to the multiplication gate electrode 31, an electric field concentrates on the edge 31a of the multiplication gate electrode 31 in contact with the insulation film 34. As illustrated in FIG. 14, for example, the edge 31a is made flush with the interface between the charge barrier portion 26 and the semiconductor substrate 20. On the surface 20a, the potential for the semiconductor substrate 20 is deeper than the charge barrier portion 26 (solid line C in FIG. 14) while the impurity concentration of the semiconductor substrate 20 is lower than that of the charge barrier portion 26. This configuration generates a potential dip at the interface between the charge barrier portion 26 and the semiconductor substrate 20. The electric charge stored in the charge holding portion 22 partially moves to the potential dip generated at the surface 20a of the semiconductor substrate 20 before VMG goes to high bias. Even if VMG goes to high bias thereafter, a potential difference between the potential dip and the charge barrier portion 26 is smaller than a potential difference between the charge holding portion 22 and the charge barrier portion 26. The electric charge multiplication efficiency may degrade. As illustrated in FIG. 13, on the other hand, the multiplication gate electrode 31 is formed so that its edge 31a is positioned toward the charge barrier portion 26 away from the boundary between the charge barrier portion 26 and the semiconductor substrate 20. This configuration can prevent a potential dip from occurring.

The embodiment arranges the gate electrodes 30, 31, 32, and 33 in this order. According to this configuration, the multiplication gate electrode 31 is favorably narrower than the charge barrier portion 26 in the arrangement direction. That is, the charge barrier portion 26 is favorably exposed from a region between the multiplication gate electrode 31 and the transfer gate electrode 30 and from a region between the multiplication gate electrode 31 and the ROG electrode 32 on the surface 20a of the semiconductor substrate 20. This is because the region between the multiplication gate electrode 31 and the transfer gate electrode 30 exhibits a lower impurity concentration than the above-mentioned element isolation region (or does not ensure insulation properties like an insulation film), easily causing a potential dip. According to the embodiment, the multiplication gate electrode 31 is narrower than the charge barrier portion 26 in the arrangement direction. This can hinder occurrence of a potential dip in the region between the multiplication gate electrode 31 and the transfer gate electrode 30 and the region between the multiplication gate electrode 31 and the ROG electrode 32. Therefore, an electric charge can be multiplied effectively.

According to the embodiment, a high bias voltage as VMG is applied twice or more to the multiplication gate electrode 31 during the multiplication period. This can effectively multiply an electric charge compared to one cycle of high bias as VMG. It is possible to configure the number of times to apply a high bias voltage. Designers can configure any amount of electric charge multiplication.

The unit pixel 10 according to the embodiment includes the FD portion 23 and the RD portion 24 connected with the source follower circuit 27. The unit pixel 10 also includes the ROG electrode 32 and the RG electrode 33 to transfer electric charges. The solid-state imaging device according to the embodiment can provide a CMOS image sensor as an area sensor including the unit pixels 10 arranged in a two-dimensional matrix.

(Modification of the First Embodiment)

Figure 15:
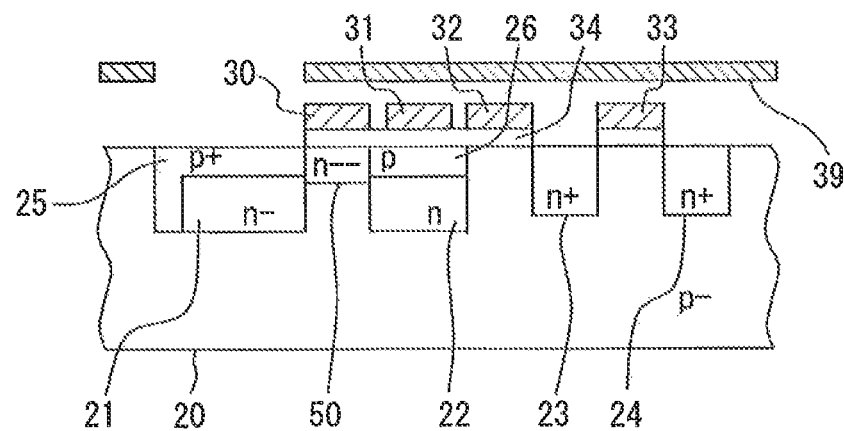
FIG. 15 is a cross sectional view of a pixel as a modification of the first embodiment.

According to the embodiment, the semiconductor substrate 20 includes the region configured as conductivity type P (p−) immediately below the transfer gate electrode 30. As illustrated in FIG. 15, the region favorably includes a low concentration region 50 configured as conductivity type N (n−) whose impurity concentration is lower than the photoelectric conversion portion 21. This configuration can deepen the potential for the region immediately below the transfer gate electrode 30 and increase a fringe electric field between the photoelectric conversion portion 21 and the charge holding portion 22. It is possible to decrease the amount of remaining electric charge to be transferred to the charge holding portion 22 from the photoelectric conversion portion 21.

(Second Embodiment)

Figure 16:
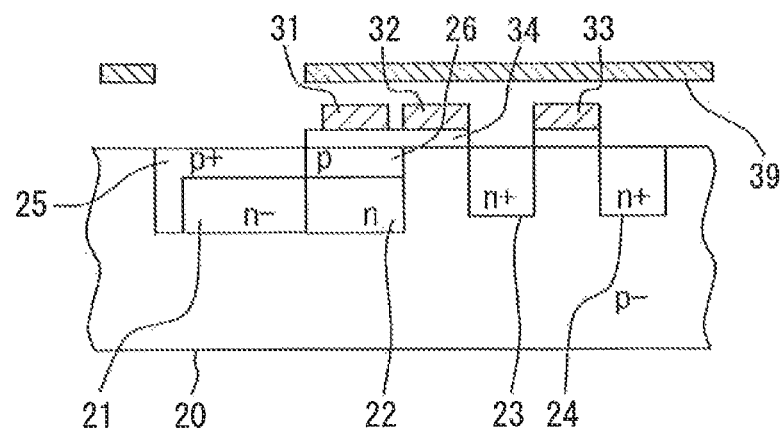
FIG. 16 is a cross sectional view illustrating a schematic configuration of a pixel according to a second embodiment.

The first embodiment provides the example of forming the photoelectric conversion portion 21 and the charge holding portion 22 separately from each other. However, the present disclosure is not limited thereto. As illustrated in FIG. 16, for example, the photoelectric conversion portion 21 and the charge holding portion 22 may be formed adjacently to each other.

Such a configuration transfers an electric charge to the charge holding portion 22 from the time the photoelectric conversion portion 21 generates the electric charge according to photoelectric conversion. After a lapse of predetermined exposure time, applying clock pulse VMG to the multiplication gate electrode 31 multiplies the electric charge. The pixel 10 according to the second embodiment does not include the transfer gate electrode 30 unlike the first embodiment. The second embodiment can decrease the number of gate electrodes in the unit pixel 10 compared to the configuration according to the first embodiment. The pixel size can be miniaturized. Since the transfer gate electrode 30 need not be provided, it is possible to decrease an area to provide the gate electrode from the unit pixel 10 and increase an area for the photoelectric conversion portion 21 to improve the sensitivity. The configuration of logic circuitry including the TG 16 can be simplified because there is no need to control dock pulse Vtr applied to the transfer gate electrode 30.

(Third Embodiment)

Figure 17:
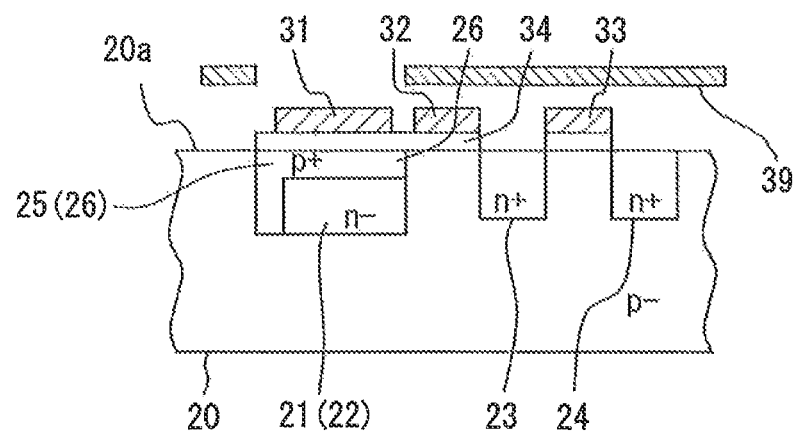
FIG. 17 is a cross sectional view illustrating a schematic configuration of a pixel according to a third embodiment.

The first and second embodiments provide the examples of independently forming the photoelectric conversion portion 21 and the charge holding portion 22. However, the present disclosure is not limited thereto. As illustrated in FIG. 17, for example, the photoelectric conversion portion 21 and the charge holding portion 22 may be formed in the same region. In other words, the photoelectric conversion portion 21 is also used as the charge holding portion 22. This configuration forms the insulation film 34 and the multiplication gate electrode 31 over the photoelectric conversion portion 21.

In such a configuration, the hole accumulation layer 25 corresponds to the charge barrier portion 26. The potential positionally corresponding to the photoelectric conversion portion 21 in the thickness direction of the semiconductor substrate 20 approximately equals the potential positionally corresponding to the charge holding portion 22 according to the first embodiment. Applying clock pulse VMG to the multiplication gate electrode 31 can multiply an electric charge.

Similarly to the second embodiment, the pixel 10 according to the third embodiment does not include the transfer gate electrode 30. The third embodiment can decrease the number of gate electrodes in the unit pixel 10 compared to the configuration according to the first embodiment. The photoelectric conversion portion 21 is also used as the charge holding portion 22. The pixel size can be further reduced compared to the second embodiment. It is possible to decrease an area to provide the gate electrode from the unit pixel 10 and increase an area for the photoelectric conversion portion 21 to improve the sensitivity. The configuration of logic circuitry including the TG 16 can be simplified because there is no need to control clock pulse Vtr applied to the transfer gate electrode 30.

(Fourth Embodiment)

The above-mentioned embodiments provide the examples of forming the multiplication gate electrode 31 on the surface 20a of the semiconductor substrate 20 via the insulation film 34. According to the fourth embodiment, as illustrated in FIG. 18, the semiconductor substrate includes the multiplication gate electrode 31 shaped into a trench in the thickness direction of the semiconductor substrate 20.

Figure 19:
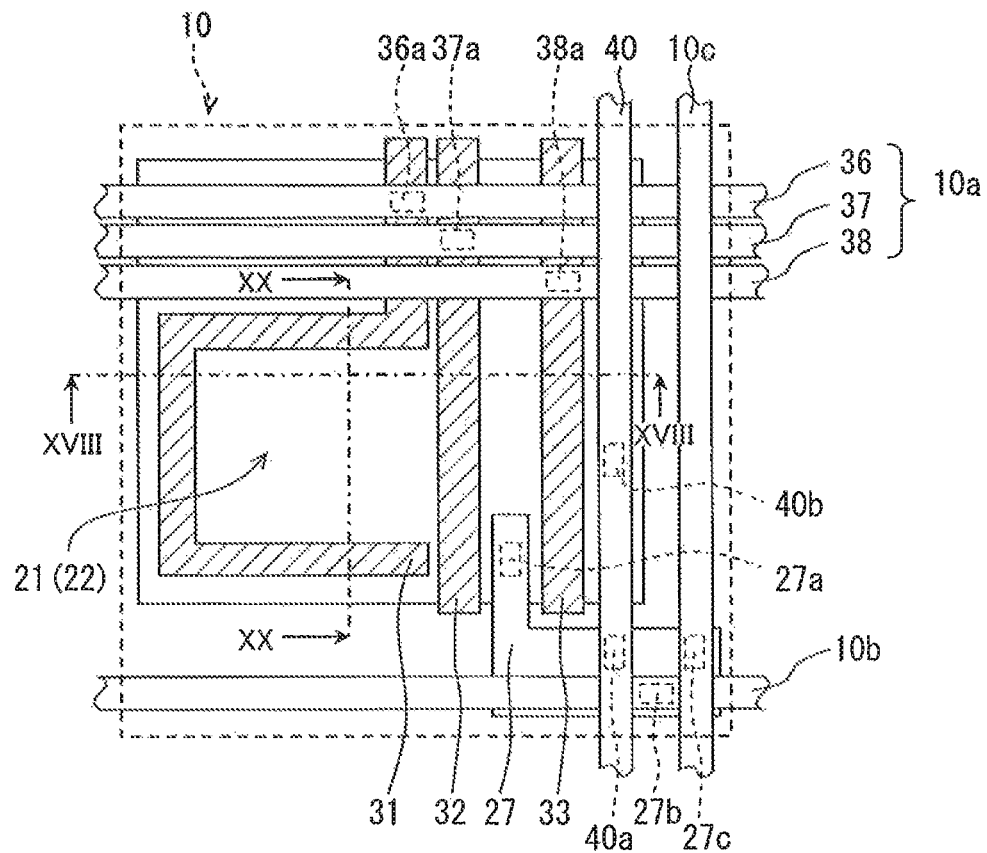
FIG. 19 is a top view illustrating an example pixel layout.
Figure 20:
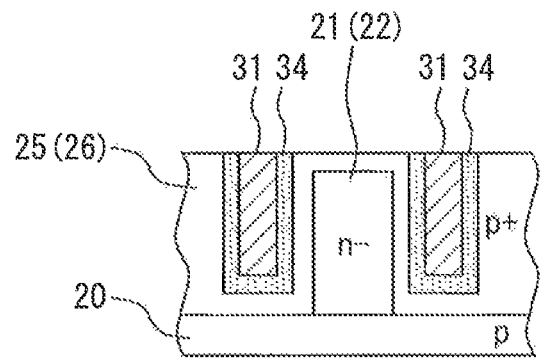
FIG. 20 is a cross sectional view of a pixel taken along line XX-XX of FIG. 19 and schematically illustrates a configuration of the pixel.

According to the fourth embodiment similarly to the third embodiment, the photoelectric conversion portion 21 and the charge holding portion 22 are formed in the same region. The photoelectric conversion portion 21 is also used as the charge holding portion 22. That is, the hole accumulation layer 25 is also used as the charge barrier portion 26. The multiplication gate electrode 31 according to the embodiment is formed so that it is partially exposed from the surface 20a of the semiconductor substrate 20 and is contained in the hole accumulation layer 25. The insulation film 34 is placed between the multiplication gate electrode 31 and the hole accumulation layer 25. As illustrated in FIG. 19, the multiplication gate electrode 31 according to the embodiment is formed to enclose the photoelectric conversion portion 21 (charge holding portion 22). That is, as illustrated in FIG. 20, the multiplication gate electrode 31 is perpendicular to the direction of arranging the photoelectric conversion portion 21, the FD portion 23, and the RD portion 24. The multiplication gate electrode 31 sandwiches the photoelectric conversion portion 21 (charge holding portion 22) in the direction along the surface 20a. FIG. 18 is a cross sectional view taken along line XVIII-XVIII of FIG. 19. FIG. 20 is a cross sectional view taken along line XX-XX of FIG. 19.

Figure 18:
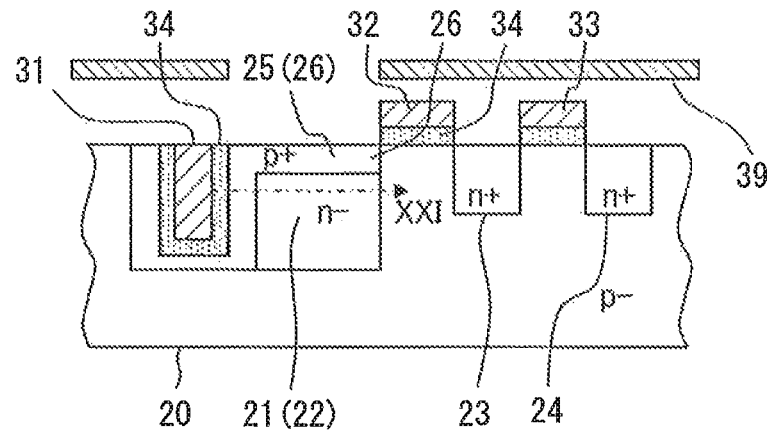
FIG. 18 is a cross sectional view of a pixel according to a fourth embodiment taken along line XVIII-XVIII of FIG. 19 and schematically illustrates a configuration of the pixel.
Figure 21:
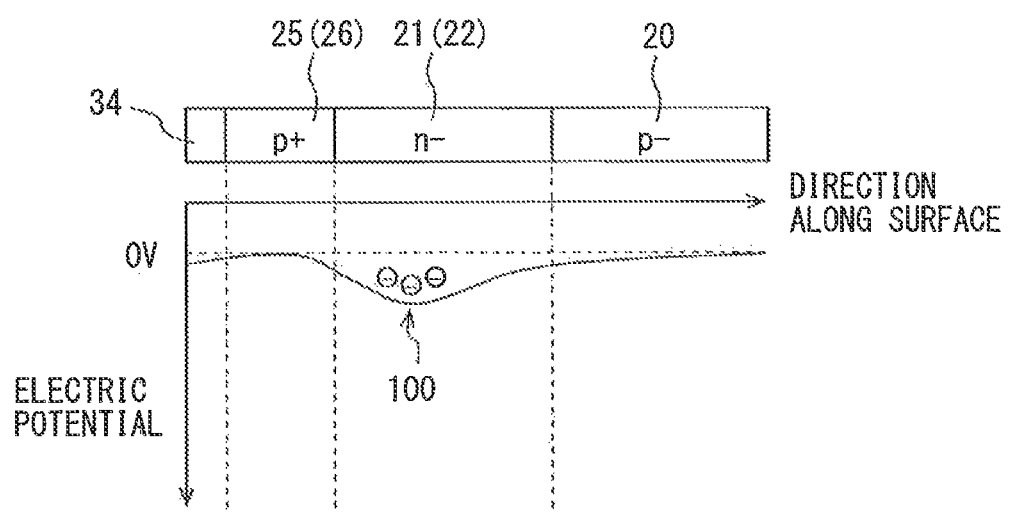
FIG. 21 is a potential chart illustrating electric potential shapes for the pixel in a direction along one surface of a semiconductor substrate.

As illustrated in FIG. 18, the configuration according to the embodiment arranges the multiplication gate electrode 31, the insulation film 34, the hole accumulation layer 25 (charge barrier portion 26), and the photoelectric conversion portion 21 (charge holding portion 22) in this order in the direction along the surface 20a. As illustrated in FIG. 21, the potential in this arrangement direction is shaped to form a potential well in the photoelectric conversion portion 21 (charge holding portion 22). The potential is shaped similarly to the potential positionally corresponding to the charge holding portion 22 in the thickness direction of the semiconductor substrate 20 according to the above-mentioned embodiments. Applying clock pulse VMG to the multiplication gate electrode 31 can multiply an electric charge. The potential illustrated in FIG. 21 corresponds to that in the XXI direction in FIG. 18.

The trench shape of the multiplication gate electrode 31 can prevent the multiplication gate electrode 31 and the insulation film 34 from interfering the incident light. This can ensure the amount of light incident on the photoelectric conversion portion 21 when the photoelectric conversion portion 21 is also used as the charge holding portion 22 according to the third and fourth embodiments.

The embodiment has provided the example of forming the multiplication gate electrode 31 so that it surrounds the photoelectric conversion portion 21 (the charge holding portion 22) as illustrated in FIG. 19. The charge barrier portion 26 and the insulation film 34 may just need to be placed between the trench-shaped multiplication gate electrode 31 and the charge holding portion 22. However, as described in the embodiment, increasing the area of the multiplication gate electrode 31 facing the charge holding portion 22 can more effectively multiply electric charges.

(Fifth Embodiment)

The above-mentioned embodiments use low bias of 0 V for dock pulse VMG applied to the multiplication gate electrode 31. The fifth embodiment uses the low bias lower than 0 V. The following describes an example of setting the low bias to −0.5 V.

Figure 22:
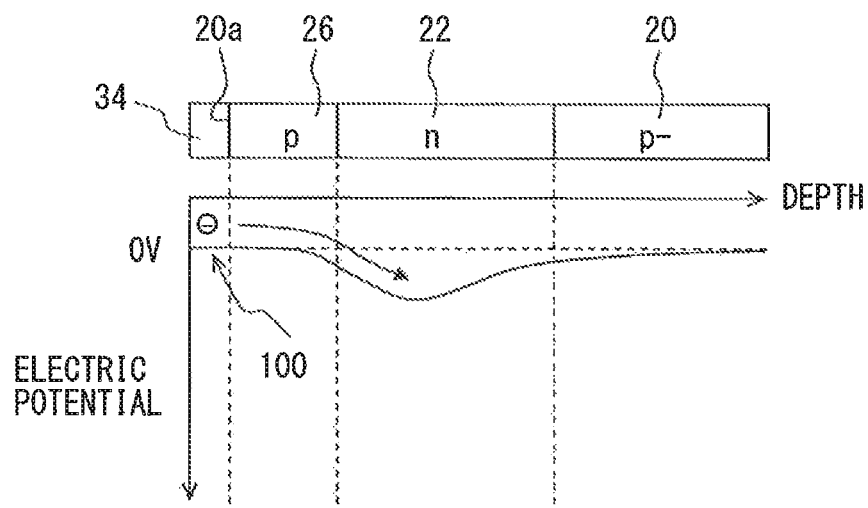
FIG. 22 is a potential chart illustrating electric potential shapes for the pixel according to a fifth embodiment in a thickness direction of a semiconductor substrate.

As described in the first embodiment, the example of setting low bias to 0 V uses N-type polysilicon for the multiplication gate electrode 31. The interface between the insulation film 34 and the multiplication gate electrode 31 exhibits a slightly positive electric potential in the potential including the charge barrier portion 26 and the charge holding portion 22 in the thickness direction of semiconductor substrate 20. Suppose a case where VMG applied to the multiplication gate electrode 31 transitions into low bias from high bias in the charge holding portion 22. The signal charge 100 moves to the side of the surface 20a of the semiconductor substrate 20 so that the signal charge 100 is multiplied. In this case, the signal charge 100 may not partially be transferred to the charge holding portion 22 and may remain near the surface 20a. On the other hand, the embodiment sets low bias to a negative value such as −0.5 V. As illustrated in FIG. 22, the embodiment can approximate an electric potential for the interface between the insulation film 34 and the multiplication gate electrode 31 to the ground electric potential. Therefore, the embodiment can transfer the signal charge 100 to the charge holding portion 22 without leaving the signal charge 100 near the surface 20a.

(Other Embodiments)

While there have been described specific preferred embodiments of the present disclosure, it is to be distinctly understood that the present disclosure is not limited thereto but may be otherwise variously embodied within the spirit and scope of the disclosure.

The fourth embodiment describes the example in which the pixel 10 includes the trenched multiplication gate electrode 31 and the photoelectric conversion portion 21 is also used as the charge holding portion 22. However, the multiplication gate electrode 31 may be trenched even if the photoelectric conversion portion 21 and the charge holding portion 22 are provided independently. Specifically, the trenched multiplication gate electrode 31 may be formed to sandwich the charge holding portion 22 in the direction perpendicular to the direction of arranging the photoelectric conversion portion 21, the charge holding portion 22, the FD portion 23, and the RD portion 24 and in the direction along the surface 20a.

Figure 23:
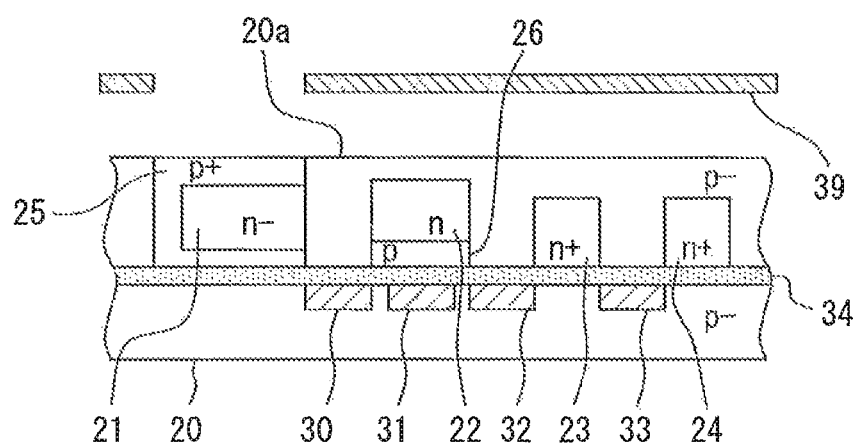
FIG. 23 is a cross sectional view of a pixel according to another embodiment.

Alternatively, as illustrated in FIG. 23, the multiplication gate electrode 31 may be embedded in the semiconductor substrate 20. According to this embodiment, the semiconductor substrate 20 is available as an SOI substrate, for example. An insulation layer included in the SOI substrate can function as the insulation film 34 described in the above-mentioned embodiments if the insulation layer is provided between the multiplication gate electrode 31 and the charge holding portion 22. The charge barrier portion 26 is formed between the charge holding portion 22 and the insulation film 34. The embodiment can prevent an effect of noise due to the surface level because the charge barrier portion 26, the FD portion 23, or the RD portion 24 is not exposed from the surface 20a of the semiconductor substrate 20. An electric charge can be multiplied without needing to provide the light receiving surface with the multiplication gate electrode 31 as required for the third embodiment even if the photoelectric conversion portion 21 is also used as the charge holding portion 22. An electric charge can be multiplied without needing to provide a space to form a trench as required for the fourth embodiment. The pixel size can be further miniaturized compared to the third and fourth embodiments. The unit pixel 10 can reduce the area to arrange the gate electrodes and increase the area for the photoelectric conversion portion 21 to improve the sensitivity. FIG. 23 illustrates the configuration to embed the transfer gate electrode 30, the ROG electrode 32, and the RG electrode 33 in the semiconductor substrate 20. Only the multiplication gate electrode 31 may be embedded.

The above-mentioned embodiments describe the examples of arranging unit pixels 10 in a two-dimensional matrix to be used as an area sensor. It is also possible to one-dimensionally provide the unit pixels 10 to be used as a linear sensor.

The above-mentioned embodiments describe the examples of a CMOS image sensor using the unit pixel 10 that includes the FD portion 23 and the RD portion 24. An electric charge stored in the charge holding portion 22 is transferred to the FD portion 23 (including the source follower circuit 27). The RD portion 24 resets an electric charge for the FD portion 23. However, the present disclosure is not limited thereto. For example, an electric charge stored in the charge holding portion 22 may be transferred to a CCD image sensor including a vertical register using a charge-coupled device (CCD).

The above-mentioned embodiments describe the examples of the semiconductor substrate 20 set to the ground electric potential. However, the present disclosure is not limited thereto. It should be noted that the dock pulses (Vtr, VMG, VROG, and VRG) are applied to the transfer gate electrode 30, the multiplication gate electrode 31, the ROG electrode 32, and the RG electrode 33 and favorably use low bias voltages lower than or equal to the electric potential for the semiconductor substrate 20.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A solid-state imaging device comprising:
a plurality of pixels,
wherein each pixel includes:
a photoelectric conversion portion that has a second conductive type, is arranged in a surface layer portion of a surface of a semiconductor substrate having a first conductivity type, and converts light incident on the surface into an electric charge;
a charge holding portion that has a second conductive type, stores the electric charge generated in the photoelectric conversion portion, and is arranged in the semiconductor substrate;
a multiplication gate electrode that is capacitively coupled with the charge holding portion, and is arranged on the semiconductor substrate via an insulation film; and
a charge barrier portion that is arranged between the charge holding portion and the insulation film at a position where the multiplication gate electrode and the charge holding portion are capacitively coupled, has a first conductivity type with a higher impurity concentration than the semiconductor substrate, causes the charge holding portion to hold the electric charge until an electric field in a depth direction of the semiconductor substrate reaches an electric field capable of avalanche multiplication when a voltage is applied to the multiplication gate electrode, and generates the avalanche multiplication of the electric charge in the depth direction when a predetermined voltage is applied to the multiplication gate electrode.

2. The solid-state imaging device according to claim 1, wherein at least a part of the multiplication gate electrode is arranged over the surface of the semiconductor substrate via the insulation film so as to overlap with the charge holding portion in a thickness direction perpendicular to the surface;
wherein the charge barrier portion is arranged in a surface layer portion of the surface of the semiconductor substrate; and
wherein at least a part of the charge barrier portion overlaps with the multiplication gate electrode in a direction perpendicular to the surface.

3. The solid-state imaging device according to claim 1, wherein the multiplication gate electrode is arranged in a trench disposed on the surface of the semiconductor substrate in a thickness direction perpendicular to the surface; and
wherein at least a part of the charge barrier portion overlaps with the multiplication gate electrode in a horizontal direction parallel to the surface.

4. The solid-state imaging device according to claim 2, wherein the photoelectric conversion portion and the charge holding portion separate from each other; and
wherein each pixel further includes a transfer gate electrode that is arranged over the surface of the semiconductor substrate via the insulation film between the photoelectric conversion portion and the charge holding portion.

5. The solid-state imaging device according to claim 4, wherein each pixel further includes a low concentration region having a second conductivity type and a concentration lower than the photoelectric conversion portion and the charge holding portion, and arranged at a surface layer portion of the semiconductor substrate between the photoelectric conversion portion and the charge holding portion.

6. The solid-state imaging device according to claim 2, wherein the photoelectric conversion portion and the charge holding portion are adjacent to each other.

7. The solid-state imaging device according to claim 4, wherein the charge holding portion has a higher impurity concentration than the photoelectric conversion portion.

8. The solid-state imaging device according to claim 2, wherein the charge holding portion and the photoelectric conversion portion are integrated; and
wherein the photoelectric conversion portion combines with the charge holding portion.

9. The solid-state imaging device according to claim 1, wherein only a part of the charge barrier portion overlaps with the multiplication gate electrode.

10. The solid-state imaging device according to claim 1, wherein each pixel further includes a floating diffusion portion having the second conductive type, a reset drain portion having the second conductive type, a read gate electrode, and a reset gate electrode;
wherein the floating diffusion portion is arranged at a surface layer portion of the surface of the semiconductor substrate;
wherein the floating diffusion portion is separated from the photoelectric conversion portion, the charge holding portion, and the charge barrier portion;
wherein the floating diffusion portion is connected to a source follower circuit that converts an electric charge into a voltage;
wherein the reset drain portion is arranged at a surface layer portion of the surface of the semiconductor substrate;
wherein the reset drain portion is separated from the photoelectric conversion portion, the charge holding portion, the charge barrier portion, and the floating diffusion portion;
wherein the read gate electrode is arranged over the surface of the semiconductor substrate via the insulation film between the charge barrier portion and the floating diffusion portion; and
wherein the reset gate electrode is arranged over the surface of the semiconductor substrate via the insulation film between the floating diffusion portion and the reset drain portion.

11. The solid-state imaging device according to claim 1, wherein the charge barrier portion has an impurity concentration higher than or equal to $1.5 \times 10^{17} cm^{-3}$ and lower than or equal to $3.0 \times 10^{18} cm^{-3}$.

12. The solid-state imaging device according to claim 1, wherein the plurality of the pixels is arranged in a two-dimensional matrix.

13. A method of driving the solid-state imaging device according to claim 1 comprising:
applying a clock pulse having a high bias and a low bias to the multiplication gate electrode;
applying the low bias to the multiplication gate electrode during a storage period to store an electric charge in the charge holding portion; and
applying at least the high bias to the multiplication gate electrode during a multiplication period to multiply the electric charge stored in the charge holding portion.

14. The method of driving the solid-state imaging device according to claim 13 further comprising:
applying the high bias at least twice to the multiplication gate electrode during the multiplication period.

15. The method of driving the solid-state imaging device according to claim 13, wherein the low bias is lower than an electric potential of the semiconductor substrate.

16. A solid-state imaging device comprising:
a plurality of pixels,
wherein each pixel includes:
a photoelectric conversion portion that has a second conductive type, is arranged in a surface layer portion of a surface of a semiconductor substrate having a first conductivity type, and converts light incident on the surface into an electric charge;
a charge holding portion that has a second conductive type, stores the electric charge generated in the photoelectric conversion portion, and is arranged in the semiconductor substrate;
a multiplication gate electrode that is capacitively coupled with the charge holding portion, and is arranged on the semiconductor substrate via an insulation film; and
a charge barrier portion that is arranged between the charge holding portion and the insulation film at a position where the multiplication gate electrode and the charge holding portion are capacitively coupled, and has a first conductivity type with a higher impurity concentration than the semiconductor substrate,
wherein the multiplication gate electrode is arranged in a trench disposed on the surface of the semiconductor substrate in a thickness direction perpendicular to the surface; and
wherein at least a part of the charge barrier portion overlaps with the multiplication gate electrode in a horizontal direction parallel to the surface.

17. The solid-state imaging device according to claim 16, wherein the photoelectric conversion portion and the charge holding portion separate from each other; and
wherein each pixel further includes a transfer gate electrode that is arranged over the surface of the semiconductor substrate via the insulation film between the photoelectric conversion portion and the charge holding portion.

18. The solid-state imaging device according to claim 16, wherein the photoelectric conversion portion and the charge holding portion are adjacent to each other.

19. The solid-state imaging device according to claim 16, wherein the charge holding portion and the photoelectric conversion portion are integrated; and
wherein the photoelectric conversion portion combines with the charge holding portion.

* * * * *